United States Patent [19]

Enomoto et al.

[11] Patent Number: 4,708,768

[45] Date of Patent: Nov. 24, 1987

[54] SEMICONDUCTOR DEVICE FABRICATION PROCESS

[75] Inventors: Osaomi Enomoto; Katsuo Komatsuzaki, both of Miho, Japan

[73] Assignee: Texas Instruments, Dallas, Tex.

[21] Appl. No.: 24,238

[22] Filed: Mar. 10, 1987

[30] Foreign Application Priority Data

Mar. 17, 1986 [JP] Japan .................................... 61-60421

[51] Int. Cl.$^4$ .................. B44C 1/22; C03C 15/00; C03C 25/06
[52] U.S. Cl. ........................... 437/228; 29/576 W; 148/187; 156/648; 156/653; 156/657; 156/651; 427/94
[58] Field of Search ............... 427/93, 94; 156/643, 156/648, 651, 653, 657, 659.1, 662; 29/571, 576 W, 580, 578; 148/1.5, 187; 357/49

[56] References Cited

U.S. PATENT DOCUMENTS 4,331,708 5/1982 Hunter et al. .......................... 427/93
4,354,896 10/1982 Hunter et al. ....................... 156/643
4,407,696 10/1983 Han et al. ............................. 156/653

OTHER PUBLICATIONS

Nikkei Electronics, 1984, 2/27, p. 135.

Primary Examiner—William A. Powell
Attorney, Agent, or Firm—Richard Bachand; Melvin Sharp; N. Rhys Merrett

[57] ABSTRACT

A semiconductor device fabrication process comprising the following sequential steps:

Sequential formation of an oxide layer and first layer of masking material resistant both to oxidation (particularly preventing the action of oxidants, such as water vapors and $O_2$) and heat, on a principal plane of semiconductor substrate;

Patternwise removal of these two layers in overlapping positions to form wells with the above semiconductor substrate exposed at bottom;

Selective removal of the above oxide layer only around the wells thus formed to leave recesses;

Deposition of the second layer of masking material resistant both oxidation and heat on the exposed surfaces of semiconductor substrate at the bottom of the above wells and in the recesses that are left after the above selective removal of oxide layer;

Removal of the above second layer of masking material from the bottom of wells with the masking material left in the above recesses; and Selective oxidation of exposed surfaces of above semiconductor substrate under masking with the first and second layers of masking material that remain.

10 Claims, 14 Drawing Figures

PRIOR ART

SEMICONDUCTOR DEVICE FABRICATION PROCESS

BACKGROUND OF THE INVENTION

1. Field of the Invention

The present invention relates to a semiconductor device fabrication process, particularly for semiconductor devices having a patternwise oxidized film (field oxide film) formed by LOCOS (Local Oxidation of Silicon) technique used for isolation of circuit elements.

2. Description of the Prior Art

The LOCOS has hitherto been widely applied to the fabrication of semiconductor IC (Integrated Circuit) as a technique of isolating circuit elements assembled thereon. This technique oxidizes the surface of semiconductor substrate in such a manner that a selected pattern of field $SiO_2$ film may be formed to isolate circuit element regions.

Namely, as shown in FIG. 1(A), first, a principal surface of a semiconductor substrate 1 (silicon wafer) is oxidized by heating to grow a $SiO_2$ film 2, on which a $Si_3N_4$ film 3 is further formed by CVD (Chemical Vapor Deposition).

Further, as shown in FIG. 1(B), with a given pattern of photoresist (not shown) applied for masking, the above $SiO_2$ film 2 and $Si_3N_4$ film 3 are patternwise dry etched in overlapping positions to form wells 4. The exposed surfaces of semiconductor substrate at the bottom of these wells 4 are then bombarded with a boron ion beam 5 (under masking with the photoresist) for injection of channel stopper boron ions to form a boron doped layer 6.

After the remaining photoresist is removed, heating for a prolonged duration of time selectively oxidizes the exposed surfaces of substrate 1 at the bottom of wells 4 to form a field $SiO_2$ film 7, as shown in FIG. 1(C) for isolation of circuit elements.

The above isolation of circuit elements by LOCOS, which is a generally adopted technique, forms a $SiO_2$ film 7 with bird's beaks 8. These bird's beaks inevitably widen the film sideways leading to a field $SiO_2$ film 7 having a width W2 larger than needed as compared to the design width. As a result, narrower areas are available for fabrication of circuit elements. In designing, therefore, it is necessary to assign wider areas for circuit elements in consideration of the above bird's beaks 8. As circuit elements are more and more integrated for a higher density, this poses a severe difficulty in microminiaturization. For example, in case circuit elements are fabricated as memory cells, the effective cell area is reduced because of the above reason. Accordingly, to increase the cell capacity, it is often necessary to adopt a special approach, such as use of a thinner gate oxide film or adoption of the vertical capacitor technology.

On the other hand, the SWAMI (Side Wall Masked Isolation), etc. has been proposed as the technique for circuit element isolation that does not form any bird's beak 8. All these approaches are however very inferior in cost and yield because the process is composed of much more process steps as compared to the LOCOS (actually, the SWAMI requires at least six more steps) and because the process is more complicated. Further, with the SWAMI, the $Si_3N_4$ film that provides the side wall for oxidation resistant masking is rarely formed at good dimensional reproducibility (particularly in width) without using an additional number of process steps.

OBJECTS AND SUMMARY OF THE INVENTION

Accordingly, an object of the present invention is to provide a semiconductor device fabrication process that adds just a few steps to the conventional process but can effectively suppress formation of the bird's beak as mentioned above to allow isolation of circuit elements more than enough for microminiaturization necessary for higher circuit integration.

Namely, the present invention provides a semiconductor device fabrication process comprising the following sequential steps:

Sequential formation of an oxide layer and first layer of masking material resistant both to oxidation (particularly preventing the action of oxidants, such as water vapors and $O_2$) and heat on a principal plane of semiconductor substrate;

Patternwise removal of these two layers in overlapping positions to form wells with the above semiconductor substrate exposed at bottom;

Selective removal of the above oxide layer only around these wells to leave recesses;

Deposition of the second layer of masking material resistant both oxidation and heat on the exposed surfaces of semiconductor substrate at the bottom of the above wells and in the recesses that are left after the above selective removal of oxide layer;

Removal of the above second layer of masking material from the bottom of wells with the masking material left in the above recesses; and Selective oxidation of exposed surfaces of above semiconductor substrate under masking with the first and second layers of masking material that remain.

Other objects, features and advantages of the invention will appear more fully from the following detailed description thereof taken in connection with the accompanying drawings.

Figure 3A:
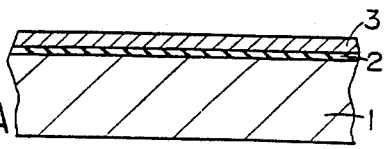
FIGS. 3 through 7 illustrates the process of the present invention.

Namely, FIGS. 3(A), (B), (C), (D), (E) and (F) are cross sections of a semiconductor substrate that illustrate the major steps of the process for fabrication of a semiconductor device having a field oxide film.

Figure 4:
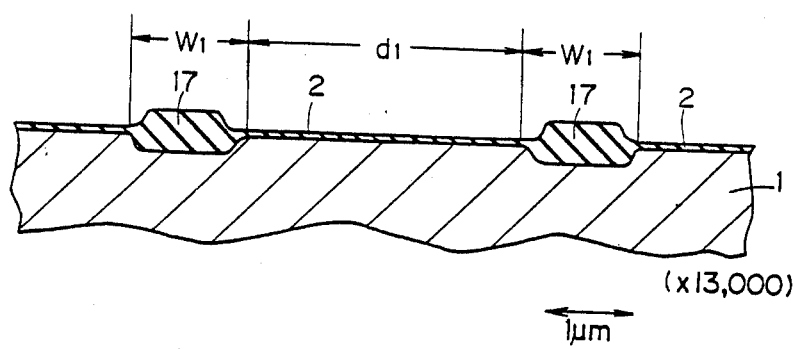

FIG. 4 is a cross section of an actual circuit element and therearound of a semiconductor device fabricated by the process of invention.

Figure 5:
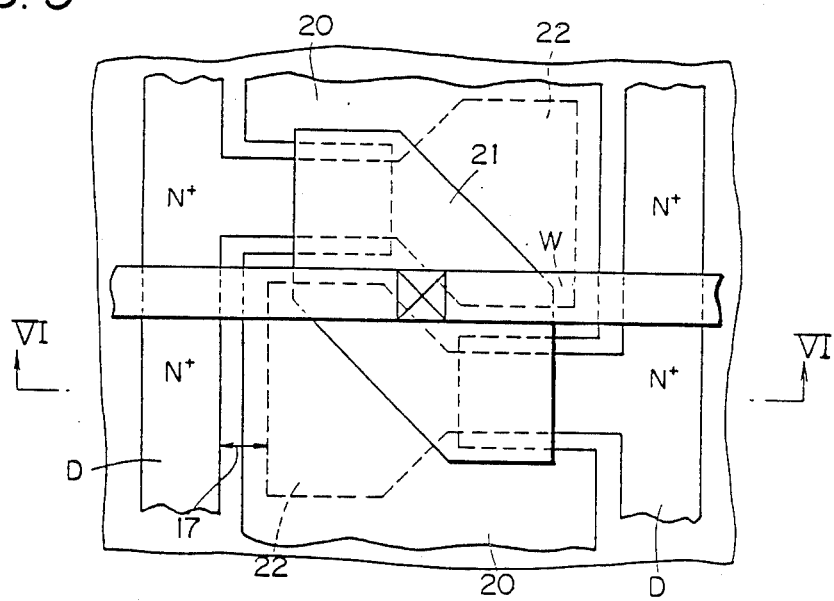

FIG. 5 is a schematic plan view of a memory cell region of a dynamic RAM IC.

Figure 6:
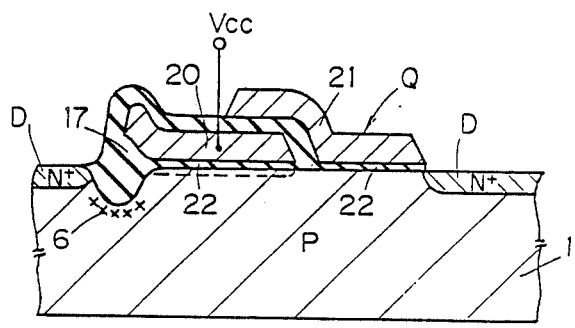

FIG. 6 is a cross section taken on line IV—IV of FIG. 5.

Figure 7:
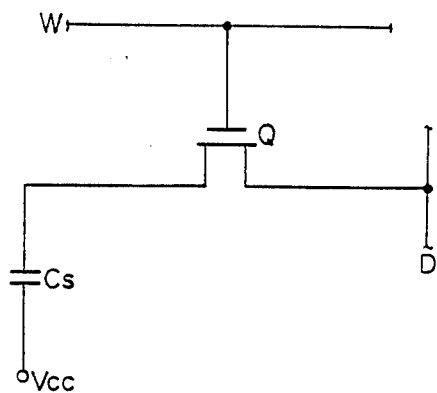

FIG. 7 is an equivalent circuit to the same memory cell.

DESCRIPTION OF THE PREFERRED EMBODIMENTS

A process embodying the invention will be described below with reference to FIG. 3. First, as shown in FIG. 3(A), a $SiO_2$ film 2 is formed to a given thickness on a principal plane of silicon substrate 1 by thermal oxidation. Further, the first $Si_3N_4$ film 3 is deposited by CVD to a given thickness on the above film 2.

Figure 3B:
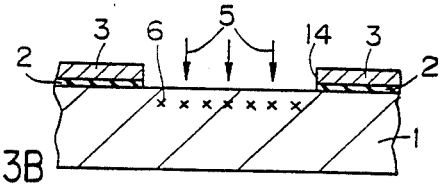

Under photoresist masking, the foundation coat, namely the $Si_3N_4$ film 3 and $SiO_2$ film 2 are successively dry etched as shown in FIG. 3(B) at a continuous step. Wells 14 with the substrate 1 exposed at bottom are thus formed. A bombardment with a boron ion beam 5 through these wells 14 results in doping of the substrate 1 with boron 6 as channel stopper.

Figure 3C:
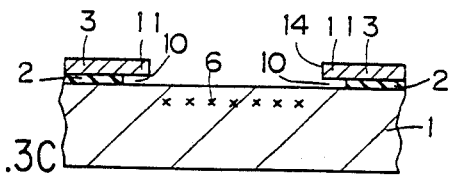

Next, moderate wet etching for a short time, for example, with 5% HF under masking with the remaining $Si_3N_4$ film 3 as shown in FIG. 3(C) removes a controlled amount of $SiO_2$ from the $SiO_2$ film 2 around the well 14 (overetching). Around the well 14, there is thus formed eaves 11 made of $Si_3N_4$ and overhanging the recess 10 that is formed by selective removal of $SiO_2$ film 2. Here wet etching is preferable to dry etching since the former gives less damages to the substrate.

Figure 3D:
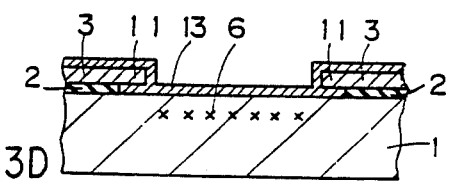

As shown in FIG. 3(D), $Si_3N_4$ is then deposited over the whole surfaces by CVD to form the second $Si_3N_4$ film 13 about 500 Å thick. Namely, $Si_3N_4$ is deposited not only over the exposed surfaces of substrate 1 but even under the $Si_3N_4$ eaves 11 to completely fill the recess 10 made by selective etching.

Figure 3E:
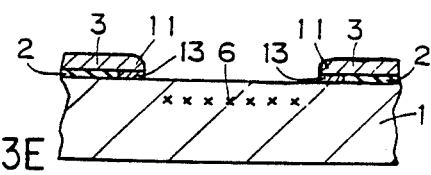

As shown in FIG. 3(E), a known technique of etch back is then applied for uniform etching of the $Si_3N_4$ film 13, leaving the newly deposited $Si_3N_4$ only under the $Si_3N_4$ eaves 11.

Figure 3F:
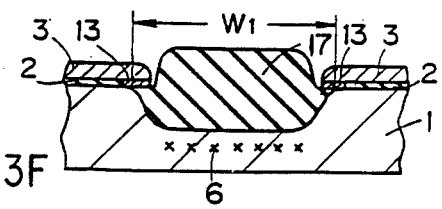

As shown in FIG. 3(F), thermal oxidation under masking with the remaining $Si_3N_4$ films 3 and 13 then forms a pattern of field $SiO_2$ film 17 to a thickness of 6500 Å. This field $SiO_2$ film 17, in combination with the presence of channel stopper 6, satisfactorily isolates individual regions of circuit elements from one another.

Next, the $Si_3N_4$ films 3 and 13 and $SiO_2$ film 2 are gradually removed by etching, and the substrate 1 is then reoxidized to form a gate $SiO_2$ film (not shown). Thereafter, intended circuit elements are fabricated by known process steps.

Figure 1A:
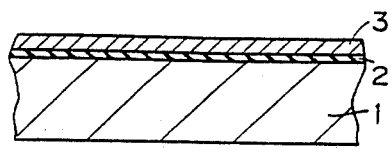
FIGS. 1(A), (B) and (C) are cross sections of a semiconductor substrate that show the major steps of a process of prior art for fabrication of a semiconductor device having a field oxide film.
Figure 1B:
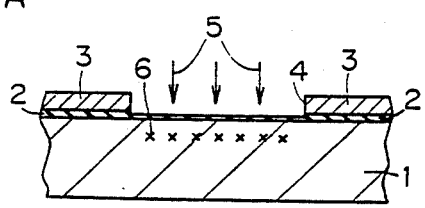
Figure 1C:
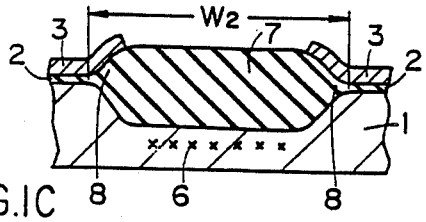

As already mentioned, the process of the present invention can be considered to be a Modified LOCOS. At the process step of FIG. 3(E) of this process, such part of the surface of substrate 1 that surrounds areas of the same surface destined for selective oxidation is covered with the second $Si_3N_4$ film 13, which is directly overlaid with the first $Si_3N_4$ film 3. At the next step of selective oxidation of FIG. 3(F), therefore, the surface of substrate 1 except for the areas thereof to be oxidized is fully covered with the $Si_3N_4$ layers, preventing any penetration of the oxidant (for example, $H_2O$ or $O_2$) or other unpreferable effect. As a result, since unnecessary oxidation of the surface of substrate 1 beyond the specified areas can be avoided, the field $SiO_2$ film 17 (namely, the circuit element region) is formed practically without any bird's beak and therefore almost in the same size as the resist pattern used for the formation of well 14 in FIG. 3(B). Accordingly, the width W1 of the field $SiO_2$ film 17 thus formed is substantially narrower than the corresponding width W2 of FIG. 1(C) achieved by the prior art. The reason is as follows. With the process of prior art, an oxidant invades from outside across the $SiO_2$ film 2 that is provided just below the $Si_3N_4$ film 3 to cause excessive oxidation of the surface of substrate 1 beyond the intended area leading to formation of bird's beaks 7, while with the present embodiment the second $Si_3N_4$ film 13 effectively prevents such invasion of oxidant.

Further, with the above embodiment, as far as the etching condition is controlled at the step of FIG. 3(C), the marginal width of the $Si_3N_4$ eaves 11 or overetching of the $SiO_2$ film 2 can be controlled as designed. Accordingly, the second $Si_3N_4$ film 13 that is left after etch back as shown in FIG. 3(E) can be given a proper width at high reproducibility. This means accurate reproduction of the width W1 of field $SiO_2$ film 17 or the width d1 of the circuit element region. Further, in this case, even if the second $Si_3N_4$ film 13 itself, which is just intended to fill the recess below the above eaves 11, is formed thin, there will be no difficulty. If so, the unnecessary material can be easily removed by the next etch back step assuring the good reproducibility of the width of the remaining $Si_3N_4$ film 13. FIG. 4 is a faithful sketch from an actual photomicrograph (magnification: $\times 13{,}000$) of a cross section of a representative part of semiconductor substrate with the field $SiO_2$ film 17 formed by the process of the present embodiment. By contrast, FIG. 2 refers to a cross section of a representative part of another semiconductor substrate fabricated by the process of prior art as mentioned above. The presence of bird's beak 8 increases the width W2 of the field $SiO_2$ film 7 substantially, leading to the width d2 of a circuit element region approx. 1 μm narrower than the corresponding width d1 of the present embodiment. This means an increase of the area of circuit element region, for example, by a factor of approx. 1.35 as compared to the prior art.

The semiconductor IC as fabricated by the process of the present embodiment can secure the design area of circuit element region more than enough, so a microminiaturized circuit pattern that can meet the requirement of circuit integration at high density can be materialized. Moreover, since this is achieved just by addition of three more steps to the process of prior art but without introduction of any new technique, the working efficiency will not be affected so much and the cost and yield will be maintained in favorable ranges.

Figure 2:
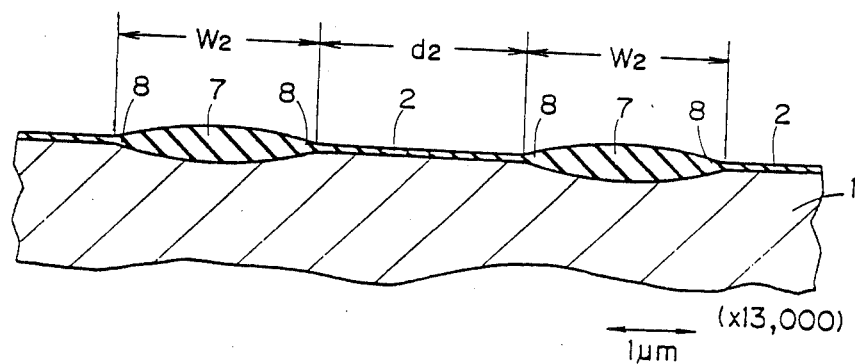
FIG. 2 is a cross section of an actual circuit element and therearound of a semiconductor device fabricated by such process.

It is noted that the specimen as sketched in FIG. 4 gave the following favorable results. First, though the measured data of the gate withstand voltage did not differ from the example of prior art as shown in FIG. 2, no crystalline defect was detected by the Schimmel etch (a technique to selectively etch defects in crystal with use of a mixture of hydrofluoric acid and chromic acid). Further, there was no problem in isolation of circuit elements since efficient isolation almost equivalent to the prior art was achieved. In the example of FIG. 4, the field $SiO_2$ film is not tapered at all and therefore has no bird's beak, so the field $SiO_2$ film itself is much less liable to variations in shape and area on oxidation or etching.

FIGS. 5 through 7 refer to a dynamic RAM (Random Access Memory) fabricated by the process of the present embodiment.

In this RAM, a pattern of field $SiO_2$ film 17 is formed as mentioned above in a principal plane of p-type silicon wafer 1 (with no bird's beak) to isolate memory cells from one another. These memory cells are each connected both to a $N^+$ type data line D that is formed by diffusion in the substrate 1 and a word line W composed of Al. For the charge storage capacity Cs in a cell, the polysilicon layer 20 that is the first layer above the gate oxide film 22 is used for the plate electrode. On the other hand, the transistor Q uses the second polysilicon layer 21 above the gate oxide film 22 for the gate electrode that is connected to the word line W.

The Modified LOCOS of the present example can fully assure the intended cell area for the above RAM in spite of the high circuit density thereof, allowing the RAM to achieve a cell capacity large enough to apply even to the 1 or 4 Mbit dynamic RAM, not to mention the 256 kbit one. Particularly, even without using a thinner gate oxide film or a special measure such as the vertical capacitor circuit layout, a sufficient cell capacity can be achieved.

It will be evident that various modifications can be made to the described embodiments without departing from the scope of the present invention.

For example, the method of forming the above oxide film and/or $Si_3N_4$ film or the etching method can be modified variously, for example, using the CVD instead of thermal oxidation and selecting the wet etching and dry one in a different combination. Also the materials of individual layers, the design of circuit elements, the conductive types of individual semiconductor regions are not limited to the above embodiments. Further, from the viewpoint of fabrication process, for example, overetching of FIG. 1(C) can be performed simultaneously when cleaning is made at the step of patterning (etching) the $Si_3N_4$ film 3. Namely, since this cleaning is wet etching with HF, also the foundation coat $SiO_2$ film 2 can simultaneously be etched to directly proceed from the step of FIG. 1(B) to the one of FIG. 1(C). In this case one process step can be saved (namely, the process of FIG. 3 can be completed by five steps, or the process steps of prior art plus two more steps). It is noted that the process of the present invention can be applied to fabrication of various semiconductor devices beside the above described as far as these devices have a field oxide film.

In the process of present invention, the oxide layer and first layer of masking material are etched and removed in the same pattern to make open wells; the remaining oxide layer is further partially etched around these open wells to form recesses therearound; the entire surface including such recesses is then covered with the second layer of masking material, which is removed by etch back except in the recesses; and finally the exposed surface of substrate is selectively oxidized. Because of presence of masking material layers, penetration of the oxidant, etc. can thus be prevented to avoid formation of the unnecessary bird's beak. As a result, the design area of circuit element region can be secured fully allowing full micropatterning that can satisfy the requirements of the circuit integration at high density. The above improvement is achieved without introduction of any new technique but just addition of some steps to the process of prior art, so there will be no substantial decline in the working efficiency while the cost and yield can be maintained in favorable ranges.

What is claimed is:

1. A semiconductor device fabrication process comprising the following sequential steps:
    sequential formation of an oxide layer and first layer of a masking material that is resistant both to oxidation and heat on a principal plane of semiconductor substrate;
    patternwise removal of these two layers at overlapping positions to form wells with the above semiconductor substrate exposed at bottom;
    selective removal of said oxide layer only around said wells to leave recesses;
    deposition of a second layer of masking material resistant both to oxidation and heat on the exposed surfaces of semiconductor substrate at the bottom of said wells and also in said recesses;
    removal of said second layer of masking material from the bottom of wells with the masking material left in said recesses; and
    selective oxidation of exposed surfaces of semiconductor substrate under masking with the remaining first and second layers of masking material.

2. A process as claimed in claim 1 wherein said first layer of masking material and said oxide layer are etched in the same pattern to form said wells and the remaining oxide layer is further overetched under masking with the remaining first layer of masking material.

3. A process as claimed in claim 1 wherein at cleaning following etching of said first layer of masking material said oxide layer is etched in the same pattern as said first layer of masking material and said oxide layer is then further continuously overetched.

4. A process as claimed in claim 2 wherein said wells are formed by dry etching while said overetching is a wet process.

5. A process as claimed in claim 3 wherein both etching of said first layer of masking material and said overetching that follows are performed by a wet process.

6. A process as claimed in claim 2 wherein said second layer of masking material is deposited in such a manner that said recesses formed by said overetching under eaves overhanging from said first layer of masking material (namely, hollow spaces with said oxide layer selectively removed) are fully filled with the masking material of said second layer.

7. A process as claimed in claim 1 wherein said second layer of masking material is etched by the etch back technique to leave the masking material of said second layer in said recesses.

8. A process as claimed in claim 1 wherein the surface of said semiconductor are patternwise oxidized under masking with said first and second layers of masking material to form a pattern of field oxide film for isolation of circuit elements.

9. A process as claimed in claim 1 wherein said oxide layer is composed of $SiO_2$ and both said first and second layers of masking material are composed of $Si_3N_4$.

10. A process as claimed in claim 1 wherein an impurity is introduced through said wells into said semiconductor substrate as channel stopper.

* * * * *